United States Patent
Lee et al.

(10) Patent No.: US 11,881,422 B2
(45) Date of Patent: Jan. 23, 2024

(54) STORAGE SYSTEM INCLUDING SHELF MOVING MODULE

(71) Applicant: SAMSUNG ELECTRONICS CO., LTD., Suwon-si (KR)

(72) Inventors: Hujong Lee, Hwaseong-si (KR); Minsoo Park, Yongin-si (KR); Jimin Choi, Suwon-si (KR); Kunjin Ryu, Suwon-si (KR); Byungkook Yoo, Hwaseong-si (KR); Seungjun Lee, Hwaseong-si (KR); Mingu Chang, Seoul (KR); Younboo Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 21 days.

(21) Appl. No.: 17/670,907

(22) Filed: Feb. 14, 2022

(65) Prior Publication Data
US 2023/0052015 A1 Feb. 16, 2023

(30) Foreign Application Priority Data
Aug. 10, 2021 (KR) .................. 10-2021-0105300

(51) Int. Cl.
*H01L 21/677* (2006.01)
*A47B 57/06* (2006.01)
(Continued)

(52) U.S. Cl.
CPC ........ *H01L 21/67769* (2013.01); *A47B 57/06* (2013.01); *B65G 1/0464* (2013.01); *B65G 1/10* (2013.01); *B66C 19/00* (2013.01)

(58) Field of Classification Search
CPC ........ H01L 21/67769; H01L 21/67733; H01L 21/6773; B66C 19/00; B65G 17/065;
(Continued)

(56) References Cited

U.S. PATENT DOCUMENTS 3,590,745 A * 7/1971 Ouska .................. B65G 17/066
104/172.3
9,695,509 B2 7/2017 Hirano et al.
(Continued)

FOREIGN PATENT DOCUMENTS

JP 2000-053237 A 2/2000
KR 10-1510614 B1 4/2015

*Primary Examiner* — Glenn F Myers
(74) *Attorney, Agent, or Firm* — Sughrue Mion, PLLC

(57) ABSTRACT

A storage system includes a storage device and a transfer device. The storage device includes a guide bar, a plurality of upper shelves connected to the guide bar, the plurality of upper shelves storing a material to be transferred, a plurality of lower shelves disposed under the plurality of upper shelves, the plurality of lower shelves storing the material, a plurality of guides connected to the plurality of upper shelves, and a shelf returning device connected to a selected upper shelf from among the plurality of upper shelves. The transfer device includes a body, a drive module attached to the body, the drive module moving the transfer device to be adjacent to the storage device, a handling module attached to the body, the handling module handling the material, and a shelf moving module attached to the body or the handling module, the shelf moving module contacting a selected guide from among the plurality of guides.

18 Claims, 16 Drawing Sheets

(51) Int. Cl.
*B65G 1/04* (2006.01)
*B65G 1/10* (2006.01)
*B66C 19/00* (2006.01)

(58) Field of Classification Search
CPC ........ B65G 1/10; B65G 1/026; B65G 1/0464; A47B 57/06
See application file for complete search history.

(56) References Cited

U.S. PATENT DOCUMENTS

| | | | |
|---|---|---|---|
| 9,842,756 B2* | 12/2017 | Bonora | H01L 21/67766 |
| 10,446,427 B2 | 10/2019 | Honda et al. | |
| 10,957,569 B2 | 3/2021 | Tawyer et al. | |
| 2011/0056900 A1* | 3/2011 | Inui | H01L 21/67706 |
| | | | 212/98 |
| 2015/0110585 A1* | 4/2015 | Ota | B65G 1/0457 |
| | | | 414/222.13 |
| 2016/0268152 A1 | 9/2016 | Fosnight et al. | |
| 2021/0138911 A1* | 5/2021 | Mizutani | B60L 9/00 |
| 2021/0331866 A1* | 10/2021 | Morimoto | H01L 21/67769 |
| 2021/0347567 A1* | 11/2021 | Torazawa | H01L 21/67769 |

* cited by examiner

STORAGE SYSTEM INCLUDING SHELF MOVING MODULE

CROSS-REFERENCE TO THE RELATED APPLICATION

This application claims priority to Korean Patent Application No. 10-2021-0105300, filed on Aug. 10, 2021, in the Korean Intellectual Property Office, the disclosure of which is incorporated by reference herein in its entirety.

BACKGROUND

1. Field

Example embodiments of the disclosure relate to a storage system including a shelf moving module, and an operating method thereof.

2. Description of Related Art

For material handling automation in a semiconductor manufacturing process, research on a transfer device and a storage device is being conducted. In order to enhance the space use efficiency of the storage device, a multi-story storage structure may be adopted. The multi-story storage structure may include a plurality of upper shelves and a plurality of lower shelves. For stacking of a material, to be transferred, on the plurality of lower shelves, position shift of the plurality of upper shelves may be required. Installing a separate drive device for position shift of the plurality of upper shelves may cause various problems such as an increase in manufacturing costs and an increase in power consumption.

SUMMARY

Example embodiments of the disclosure provide a storage system and an operating method thereof which are capable of minimizing manufacturing costs and operating costs.

According to an aspect of an example embodiment, a storage system includes a storage device; and a transfer device, wherein the storage device includes a guide bar, a plurality of upper shelves connected to the guide bar, the plurality of upper shelves storing a material to be transferred, a plurality of lower shelves disposed under the plurality of upper shelves, the plurality of lower shelves storing the material, a plurality of guides connected to the plurality of upper shelves, and a shelf returning device connected to a selected upper shelf from among the plurality of upper shelves, and wherein the transfer device includes a body, a drive module attached to the body and configured to move the transfer device to be adjacent to the storage device, a handling module attached to the body and configured to handle the material, and a shelf moving module attached to the body or the handling module, the shelf moving module contacting a selected one from among the plurality of guides.

According to an aspect of an example embodiment, an operating method of the storage system includes moving the transfer device to approach the storage device; bringing the shelf moving module into contact with the selected guide; driving, for escape, at least one upper shelf selected from among the plurality of upper shelves using a drive force of the transfer device; aligning the transfer device to be adjacent to a corresponding lower shelf from among the plurality of lower shelves over the corresponding lower shelf; stacking the material on the corresponding lower shelf; withdrawing the transfer device; and returning the at least one upper shelf using the shelf returning device.

According to an aspect of an example embodiment, a storage system includes a storage device; and a transfer device, wherein the storage device includes a guide bar, a plurality of upper shelves connected to the guide bar, the plurality of upper shelves storing a material to be transferred, a plurality of lower shelves disposed under the plurality of upper shelves, the plurality of lower shelves storing the material, and a plurality of guides connected to the plurality of upper shelves, and wherein the transfer device includes a body, a drive module attached to the body and configured to move the transfer device to be adjacent to the storage device, a handling module attached to the body and configured to handle the material, and a shelf moving module attached to the body or the handling module, the shelf moving module contacting a selected one from among the plurality of guides.

According to an aspect of an example embodiment, a storage system includes a main frame comprising a lower horizontal frame, a middle horizontal frame on the lower horizontal frame, and an upper horizontal frame on the middle horizontal frame; a guide bar connected to the middle horizontal frame; a plurality of upper shelves connected to the guide bar, the plurality of upper shelves storing a material to be transferred; a plurality of lower shelves connected to the lower horizontal frame, the plurality of lower shelves storing the material; a plurality of guides connected to the plurality of upper shelves; and a shelf returning device connected to a selected one from among the plurality of upper shelves, wherein the shelf returning device includes a connecting pin connected to the selected one from among the plurality of upper shelves, an idler connected to the middle horizontal frame, a belt connected to the connecting pin, the belt contacting the idler, and a counterweight connected to the belt.

BRIEF DESCRIPTION OF THE DRAWINGS

The above and other aspects, features, and advantages of example embodiments of the present disclosure will be more apparent from the following description taken in conjunction with the accompanying drawings, in which.

DETAILED DESCRIPTION

Figure 1:
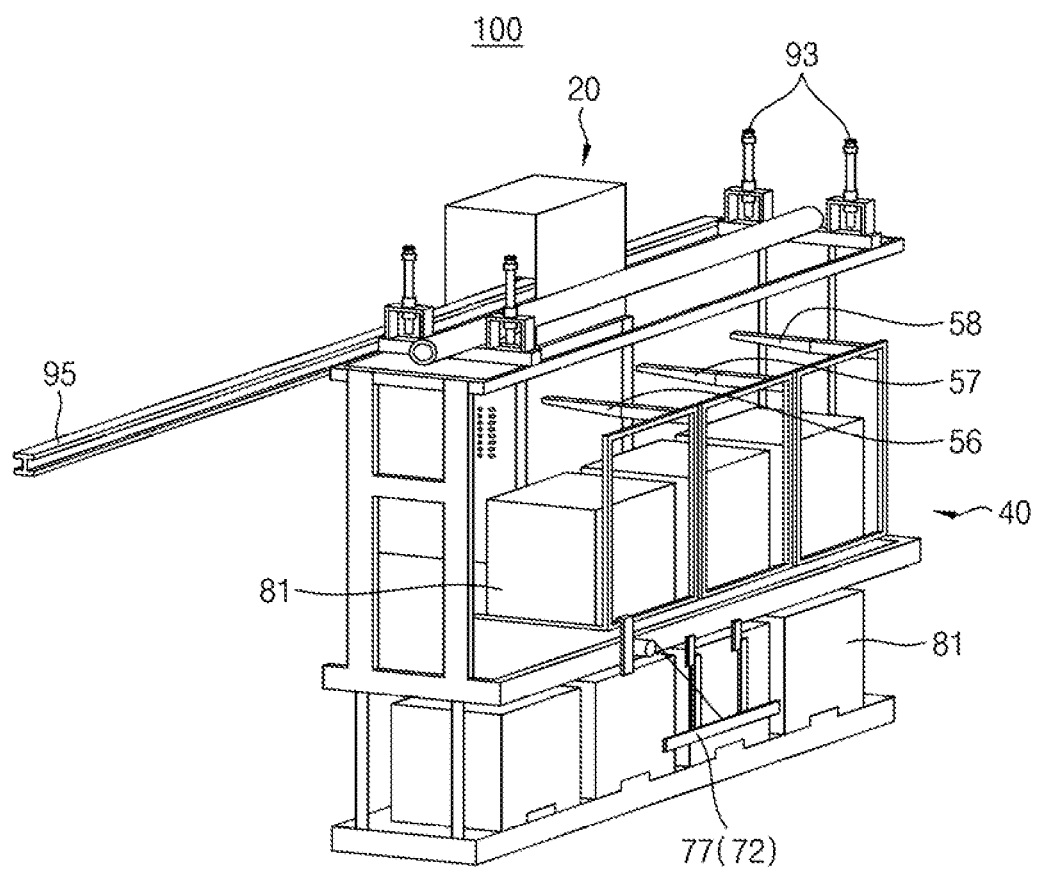
FIG. 1 is a perspective view explaining a storage system and an operating method thereof according to example embodiments.

FIG. 1 is a perspective view explaining a storage system 100 and an operating method thereof according to example embodiments.

Referring to FIG. 1, the storage system 100 according to the example embodiments may include a transfer device 20 and a storage device 40.

In an embodiment, the transfer device 20 may move along a rail 95 installed on a ceiling. The transfer device 20 may include a ceiling type transfer device such as an overhead hoist transfer (OHT) device. The storage device 40 may perform a function of storing a plurality of materials 81 to be transferred. In an embodiment, the storage device 40 may be disposed adjacent to the rail 95. The storage device 40 may be attached to the ceiling using a plurality of installation rods 93. The storage device 40 may include a ceiling type material storage device such as a side track buffer (STB). Each of the plurality of materials 81 may include a front opening unified pod (FOUP) or a front opening shipping box (FOSB).

Figure 2:
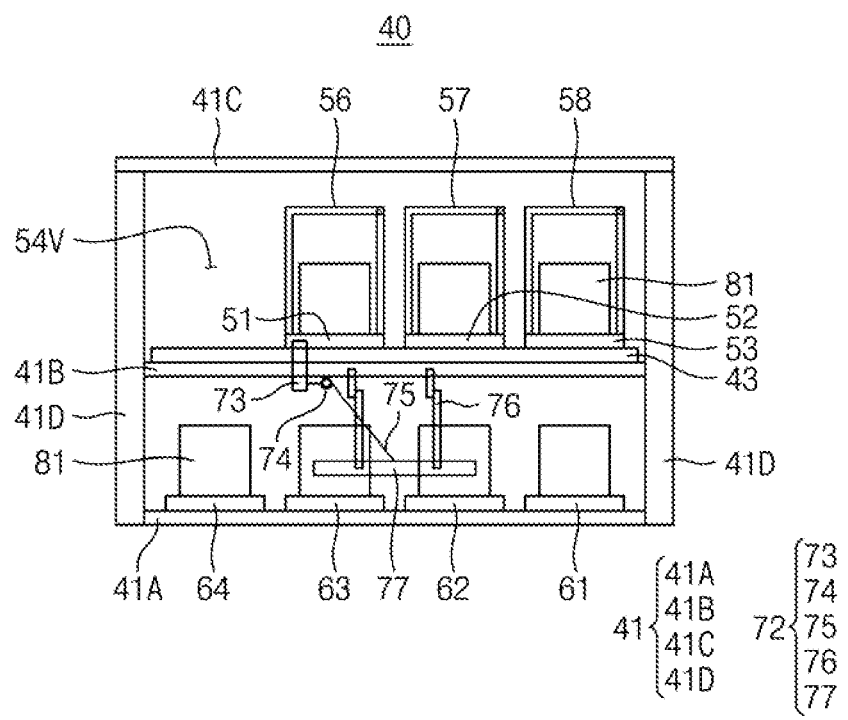
FIG. 2 is a front view explaining a storage device and an operating method thereof according to example embodiments.

FIG. 2 is a front view explaining a storage device 40 and an operating method thereof according to example embodiments.

Referring to FIG. 2, the storage device 40 may include a main frame 41, a guide bar 43, a plurality of upper shelves 51, 52 and 53, a plurality of guides 56, 57 and 58, a plurality of lower shelves 61, 62, 63 and 64, and a shelf returning device 72. A plurality of materials 81 to be transferred may be stored on the plurality of upper shelves 51, 52 and 53 and the plurality of lower shelves 61, 62, 63 and 64.

The main frame 41 may include a lower horizontal frame 41A, a middle horizontal frame 41B, an upper horizontal frame 41C, and a plurality of vertical frames 41D. Each of the lower horizontal frame 41A, the middle horizontal frame 41B, and the upper horizontal frame 41C may be connected to the plurality of vertical frames 41D. The middle horizontal frame 41B may be disposed above the lower horizontal frame 41A. The upper horizontal frame 41C may be disposed above the middle horizontal frame 41B. The middle horizontal frame 41B may be disposed between the lower horizontal frame 41A and the upper horizontal frame 41C.

Each of the plurality of lower shelves 61, 62, 63 and 64 may be connected to the lower horizontal frame 41A. The plurality of lower shelves 61, 62, 63 and 64 may include a first lower shelf 61, a second lower shelf 62, a third lower shelf 63, and a fourth lower shelf 64. The first lower shelf 61, the second lower shelf 62, the third lower shelf 63, and the fourth lower shelf 64 may be sequentially horizontally connected to the lower horizontal frame 41A. The plurality of lower shelves 61, 62, 63 and 64 may be horizontally aligned with one another along the lower horizontal frame 41A. Each of the plurality of lower shelves 61, 62, 63 and 64 may be fixed to designated positions of the lower horizontal frame 41A, respectively.

The guide bar 43 may be connected to the main frame 41. In an embodiment, the guide bar 43 may be connected to the middle horizontal frame 41B. The guide bar 43 may be disposed between the lower horizontal frame 41A and the upper horizontal frame 41C.

The plurality of upper shelves 51, 52 and 53 may be connected to the guide bar 43. The plurality of upper shelves 51, 52 and 53 may be horizontally aligned with one another along the guide bar 43. Each of the plurality of upper shelves 51, 52 and 53 may horizontally move along the guide bar 43. The number of the plurality of upper shelves 51, 52 and 53 may be smaller than the number of the plurality of lower shelves 61, 62, 63 and 64. The number of the plurality of lower shelves 61, 62, 63 and 64 may be N, and the number of the plurality of upper shelves 51, 52 and 53 may be N–1 (N being a positive integer). For example, the number of the plurality of lower shelves 61, 62, 63 and 64 may be four, and the number of the plurality of upper shelves 51, 52 and 53 may be three.

The plurality of upper shelves 51, 52 and 53 may include a first upper shelf 51, a second upper shelf 52, and a third upper shelf 53. The first upper shelf 51, the second upper shelf 52, and the third upper shelf 53 may be sequentially horizontally connected to the guide bar 43. The first upper shelf 51 may be vertically aligned on the third lower shelf 63, the second upper shelf 52 may be vertically aligned on the second lower shelf 62, and the third upper shelf 53 may be vertically aligned on the first lower shelf 61.

An empty space 54V may be present above the fourth lower shelf 64. The empty space 54V may be vertically aligned with the fourth lower shelf 64. The horizontal width of the empty space 54V may be equal to or greater than the horizontal width of the fourth lower shelf 64. Each of the plurality of lower shelves 61, 62, 63 and 64 and each of the plurality of upper shelves 51, 52 and 53 may have substantially the same horizontal width. The guide bar 43 may extend above the fourth lower shelf 64. The guide bar 43 may extend to be adjacent to the empty space 54V.

Each of the plurality of guides 56, 57 and 58 may be mounted to a corresponding one of the plurality of upper shelves 51, 52 and 53. The plurality of guides 56, 57 and 58 may include a first guide 56, a second guide 57, and a third guide 58. The first guide 56 may be mounted on the first upper shelf 51, the second guide 57 may be mounted on the second upper shelf 52, and the third guide 58 may be mounted on the third upper shelf 53.

The shelf returning device 72 may include a connecting pin 73, an idler 74, a belt 75, a plurality of support bars 76, and a counterweight 77. The connecting pin 73 may be mounted to a selected one of the plurality of upper shelves 51, 52 and 53. For example, the connecting pin 73 may be mounted to the first upper shelf 51. The first upper shelf 51 may be disposed nearest to the empty space 54V from among the plurality of upper shelves 51, 52 and 53. The shelf returning device 72 may be a counterweight system that causes a vertical movement of the counterweight 77 due to the force of gravity to be converted into horizontal movement of other elements.

The idler 74 may be mounted to the middle horizontal frame 41B. The idler 74 may be mounted at a position of the middle horizontal frame 41B adjacent to the first upper shelf 51. The idler 74 may be disposed adjacent to the connecting pin 73. The counterweight 77 may be disposed adjacent to the connecting pin 73. The plurality of support bars 76 may be connected between the middle horizontal frame 41B and the counterweight 77. The belt 75 may be connected between the connecting pin 73 and the counterweight 77. The belt 75 may contact the idler 74. The counterweight 77 may have a bar shape, a spherical shape, a polygonal pyramid shape, or a combination thereof. The counterweight 77 may be a weight of 1 to 10 kg. For example, the counterweight 77 may weigh about 7 to 8 kg. Only one support bar 76 may be provided, or the plurality of support bars 76 may be omitted.

In an embodiment, the shelf returning device 72 may be omitted.

Figure 3:
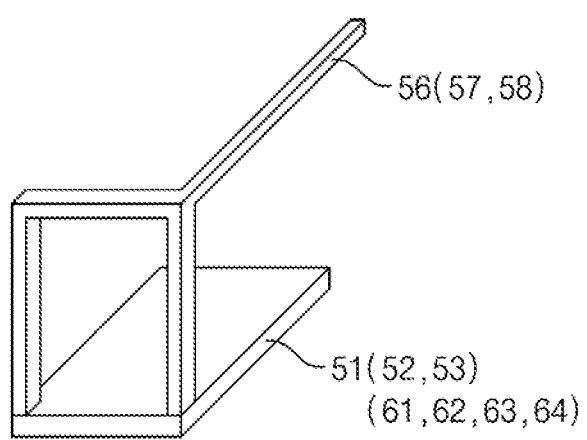
FIG. 3 is a perspective view explaining a shelf and a guide according to example embodiments.

FIG. 3 is a perspective view explaining a shelf and a guide according to example embodiments.

Referring to FIG. 3, a first upper shelf 51 may include a flat plate. Each of a second upper shelf 52, a third upper shelf 53, and a plurality of lower shelves 61, 62, 63 and 64 may include a flat plate similar to that of the first upper shelf 51. Each of a plurality of guides 56, 57 and 58 may be attached to a corresponding one of a plurality of upper shelves 51, 52 and 53. For example, the first guide 56 may be attached to the first upper shelf 51. A portion of the first guide 56 may protrude outside of the first upper shelf 51 in plan view.

Figure 4:
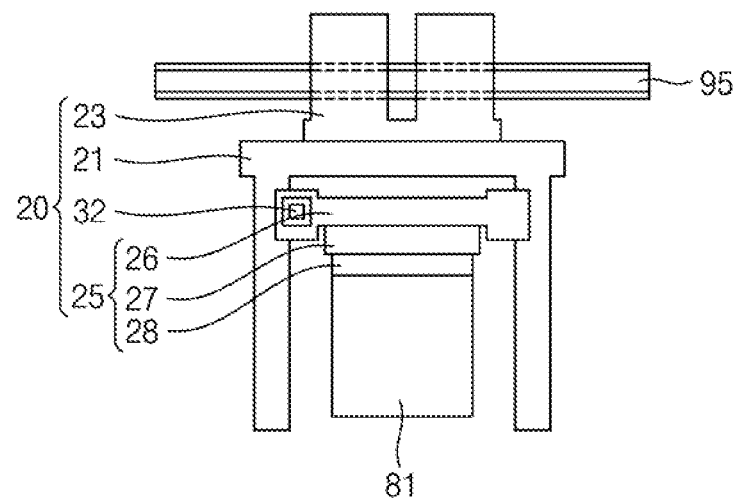
FIG. 4 is a front view explaining a transfer device and an operating method according to example embodiments.

FIG. 4 is a front view explaining a transfer device 20 and an operating method according to example embodiments.

Referring to FIG. 4, the transfer device 20 may include a body 21, a drive module 23, a handling module 25, and a shelf moving module 32. The handling module 25 may include a horizontal moving module 26, an elevation module 27, and a hand module 28.

The drive module 23 may be disposed on the body 21. The drive module 23 may be attached to the body 21. The drive module 23 may contact a rail 95. The drive module 23 may perform a function of moving the transfer device 20 to a target point along the rail 95. For example, the drive module 23 may perform a function of moving the transfer device 20 to a target point adjacent to the storage device 40 along the rail 95. The drive module 23 may include, for example, a motor or an actuator to cause the drive module to move horizontally along the guide bar 95.

The handling module 25 may be attached to a bottom surface of the body 21. The handling module 25 may function to handle a material 81 to be transferred. The handling module 25 may include, for example, a combination of actuators or motors and a gripping element to move material 81 in a vertical and/or a horizontal direction. In an embodiment, the horizontal moving module 26 may be attached to the bottom surface of the body 21. The horizontal moving module 26 may include a slide module. The horizontal moving module 26 may include, for example, an actuator or a motor to cause movement in the horizontal direction of itself and/or other elements. The elevation module 27 may be attached to a bottom surface of the horizontal moving module 26. The horizontal moving module 26 may perform a function of horizontally moving the elevation module 27. The elevation module 27 may include a hoist module. The elevation module 27 may include, for example, an actuator or a motor to cause movement in the vertical direction of itself and/or other elements. The hand module 28 may be attached to a bottom surface of the elevation module 27. The elevation module 27 may perform a function of vertically moving the hand module 28. The hand module 28 may perform a function of gripping or releasing the material 81. The hand module 28 may include, for example, a gripping element such as, for example, a claw, a vice, a hook, or the like that may be operated to grip or release the material 81.

The shelf moving module 32 may be attached to the handling module 25. In an embodiment, the shelf moving module 32 may be attached to the horizontal moving module 26. The shelf moving module 32 may contact a selected one of the plurality of guides 56, 57 and 58 (see, e.g., FIG. 2). The shelf moving module 32 may perform a function of moving at least one of the plurality of upper shelves 51, 52 and 53 (see, e.g., FIG. 2). For example, the shelf moving module 32 may perform a function of moving at least one of the plurality of upper shelves 51, 52 and 53 using drive force of the transfer device 20. The shelf moving module 32 may perform a function of moving at least one of the plurality of upper shelves 51, 52 and 53 using drive force of the drive module 23.

FIGS. 5 to 10 are side views explaining a transfer device 20 and an operating method thereof according to example embodiments.

Figure 5:
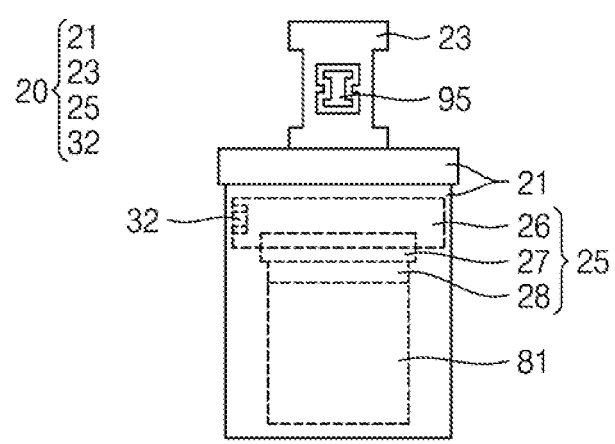
FIGS. 5 to 10 are side views explaining a transfer device and an operating method thereof according to example embodiments.

Referring to FIG. 5, the transfer device 20 may include a body 21, a drive module 23, a handling module 25, and a shelf moving module 32. The handling module 25 may include a horizontal moving module 26, an elevation module 27, and a hand module 28. The drive module 23 may contact a rail 95. The hand module 28 may perform a function of gripping or releasing a material 81 to be transferred. The shelf moving module 32 may be attached to the handling module 25. In an embodiment, the shelf moving module 32 may be attached to the horizontal moving module 26.

The body 21 may cover top surfaces and side surfaces of the handing module 25 and the material 81. The body 21 may protect the top surfaces and the side surfaces of the handling module 25 and the material 81. In an embodiment, where the shelf moving module 32 is attached to the horizontal moving module 26, the body 21 may cover a top surface and side surfaces of the shelf moving module 32. The drive module 23 may perform a function of moving the transfer device 20 to a target point along the rail 95.

Figure 6:
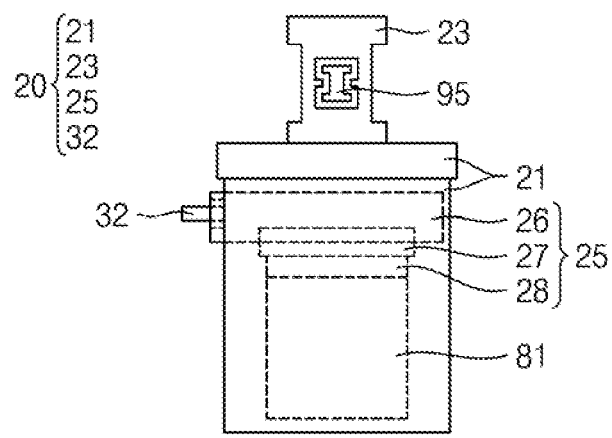

Referring to FIG. 6, at least a portion of the shelf moving module 32 may be controlled to move to a position protruding outside of the body 21. In an embodiment, where the shelf moving module 32 is attached to the horizontal moving module 26, a portion of the horizontal moving module 26 and a portion of the shelf moving module 32 may be controlled to move to a position protruding outside of the body 21.

A portion of the shelf moving module 32 may contact a selected one of the plurality of guides 56, 57 and 58. The shelf moving module 32 may perform a function of moving at least one of the plurality of upper shelves 51, 52 and 53. For example, the shelf moving module 32 may perform a function of moving at least one of the plurality of upper shelves 51, 52 and 53 using drive force of the transfer device 20. The shelf moving module 32 may perform a function of moving at least one of the plurality of upper shelves 51, 52 and 53 using drive force of the drive module 23.

Figure 7:
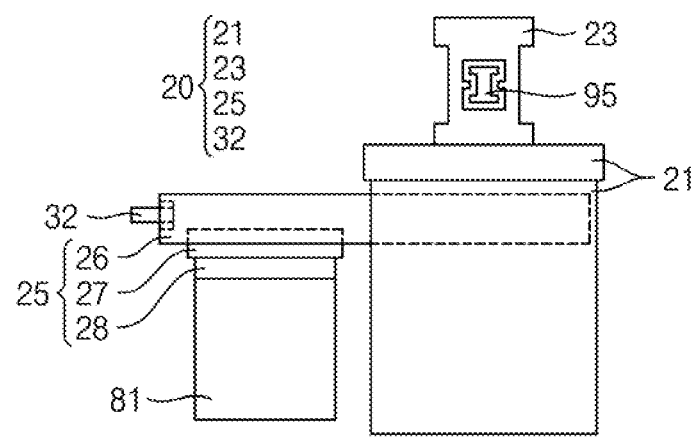

Referring to FIG. 7, the horizontal moving module 26 may be controlled to protrude outside of the body 21. In an embodiment, the elevation module 27 and the hand module 28 may move outside of the body 21 by way of the movement of the horizontal moving module 26. The material 81 may move outside of the body 21 together with the elevation module 27 and the hand module 28.

In an embodiment, where the shelf moving module 32 is attached to the horizontal moving module 26, the shelf moving module 32 may move along the horizontal moving module 26. A portion of the shelf moving module 32 may contact a selected one of the plurality of guides 56, 57 and 58.

Figure 8:
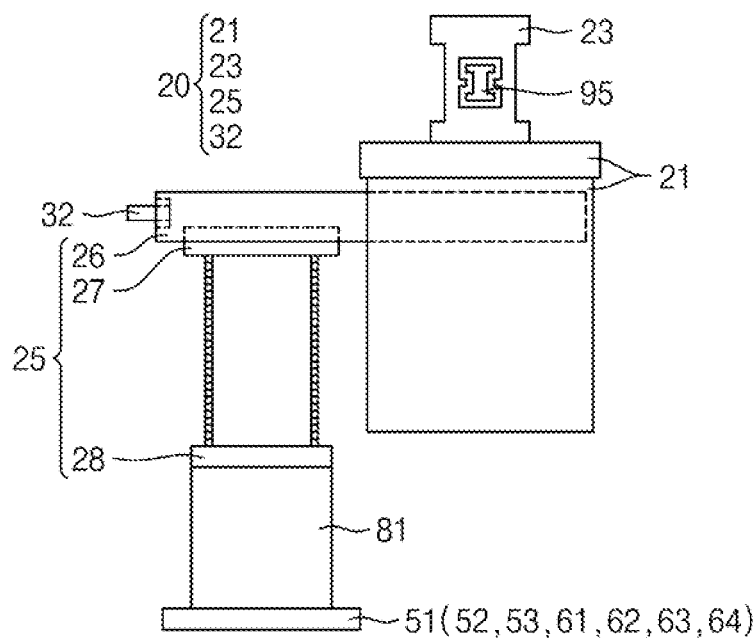

Referring to FIG. 8, the material 81 may be vertically aligned over a selected one of the plurality of upper shelves 51, 52 and 53 and the plurality of lower shelves 61, 62, 63 and 64. The elevation module 27 may perform a function of vertically moving the hand module 28. The elevation module 27 may be controlled to downwardly move the hand module 28, thereby causing the material 81 to be seated on a top surface of a selected one of the plurality of upper shelves 51, 52 and 53 and the plurality of lower shelves 61, 62, 63 and 64.

Figure 9:
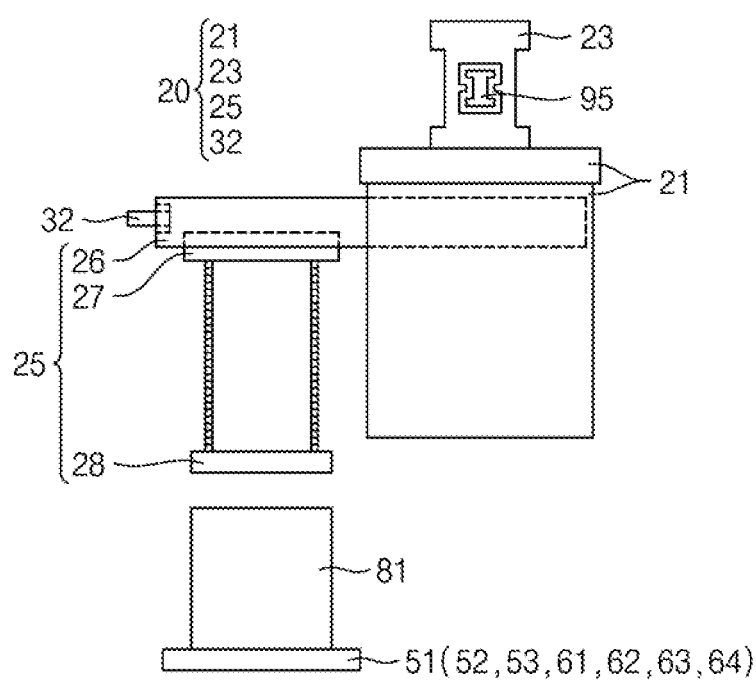

Referring to FIG. 9, the hand module 28 may perform a function of gripping or releasing the material 81. The material 81 may be seated on a top surface of a selected one of the plurality of upper shelves 51, 52 and 53 and the plurality of lower shelves 61, 62, 63 and 64. The hand module 28 may be returned by the elevation module 27.

Figure 10:
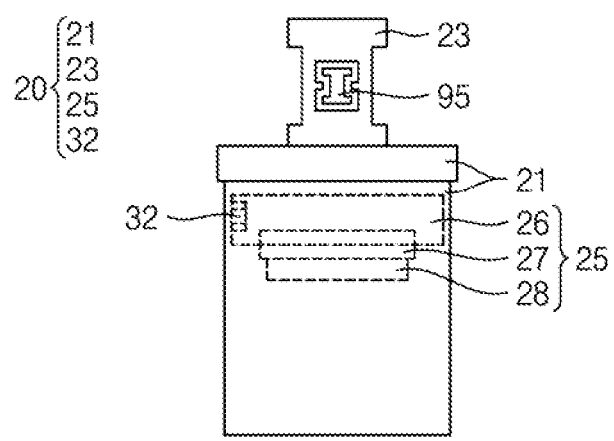

Referring to FIG. 10, the handling module 25 may be returned to inside of the body 21. In an embodiment, where the shelf moving module 32 is attached to the horizontal moving module 26, the shelf moving module 32 may be returned to the inside of the body 21.

Figure 11:
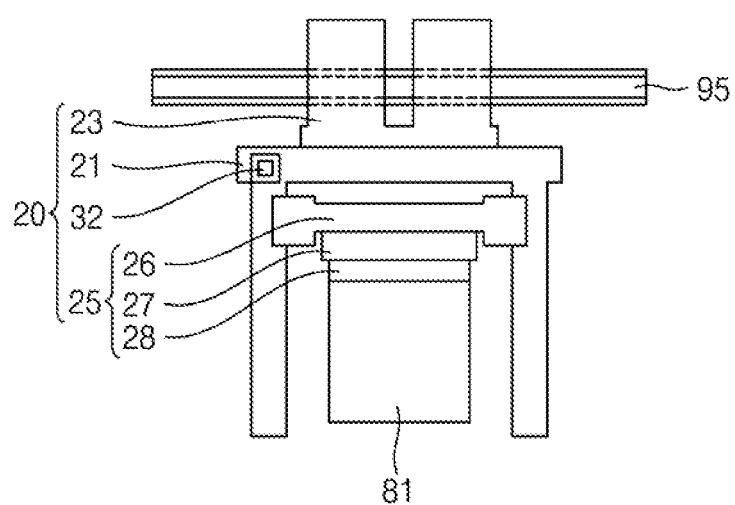
FIG. 11 is a front view explaining a transfer device and an operating method thereof according to example embodiments.

FIG. 11 is a front view explaining a transfer device 20 and an operating method thereof according to example embodiments.

Referring to FIG. 11, the transfer device 20 may include a body 21, a drive module 23, a handling module 25, and a shelf moving module 32. The handling module 25 may include a horizontal moving module 26, an elevation module 27, and a hand module 28. The shelf moving module 32 may be attached to the body 21.

In an embodiment, the shelf moving module 32 may be attached in plural to various positions of the body 21 and the handling module 25.

Figure 12:
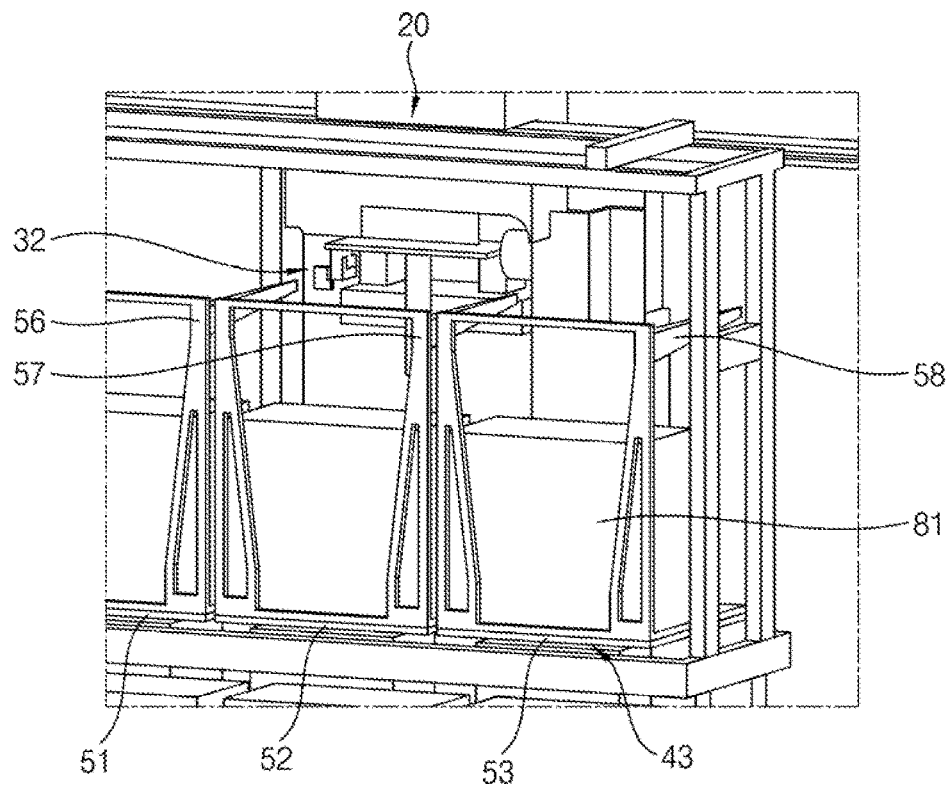
FIGS. 12 and 13 are perspective views explaining a shelf moving module and an operating method thereof according to example embodiments.
Figure 13:
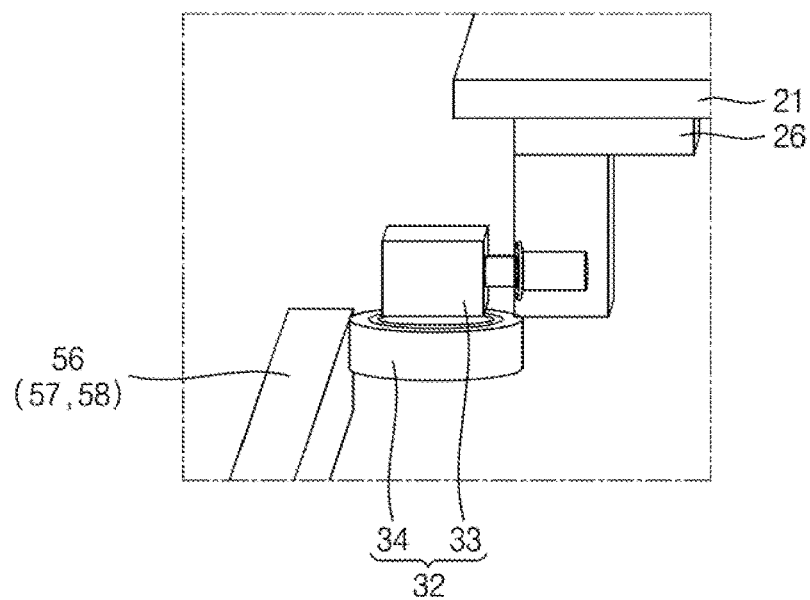

FIGS. 12 and 13 are perspective views explaining a shelf moving module 32 and an operating method thereof according to example embodiments.

Referring to FIG. 12, the shelf moving module 32 may be attached to a handling module or a body of a transfer device 20. A portion of the shelf moving module 32 may contact a selected one of a plurality of guides 56, 57 and 58. The shelf moving module 32 may perform a function of moving at least one of a plurality of upper shelves 51, 52 and 53. For example, the shelf moving module 32 may perform a function of horizontally moving at least one of the plurality of upper shelves 51, 52 and 53 along a guide bar 43 using drive force of the transfer device 20.

Referring to FIG. 13, the shelf moving module 32 may include a protrusion 33 and a roller 34. In an embodiment, the protrusion 33 may be connected to a horizontal moving module 26. The roller 34 may be connected to one end of the protrusion 33. The roller 34 may contact a selected one of the plurality of guides 56, 57 and 58. The roller 34 may perform a function of minimizing generation of dust, abrasion and noise while lengthening lifespan.

Figure 14:
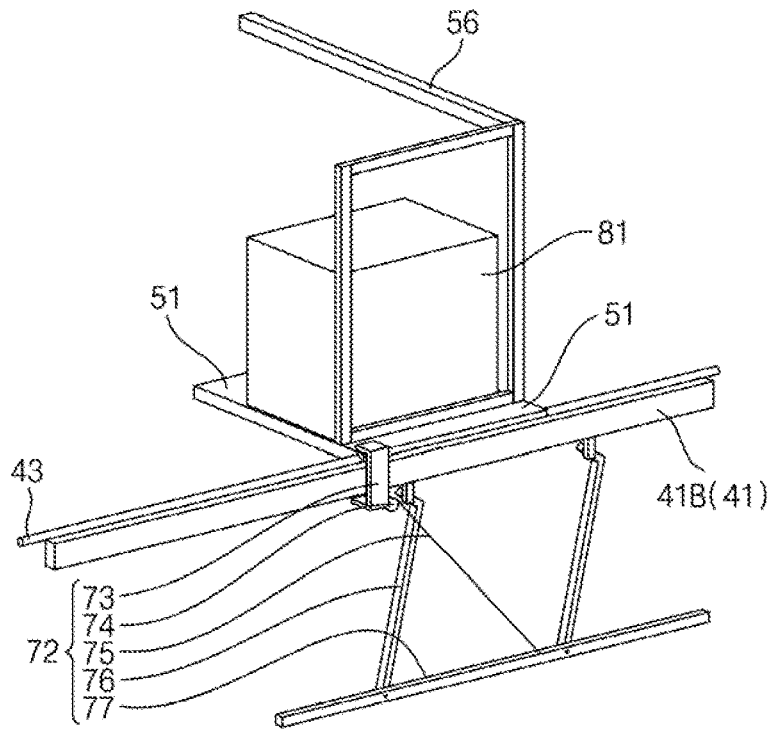
FIGS. 14 to 16 are perspective views explaining a shelf returning device and an operating method thereof according to example embodiments.
Figure 15:
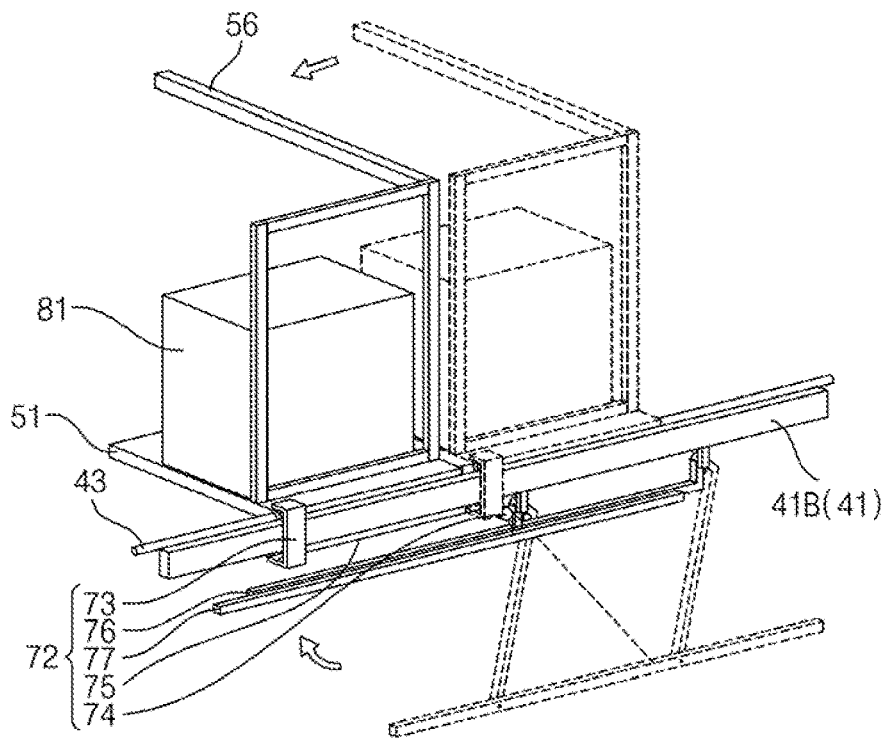
Figure 16:
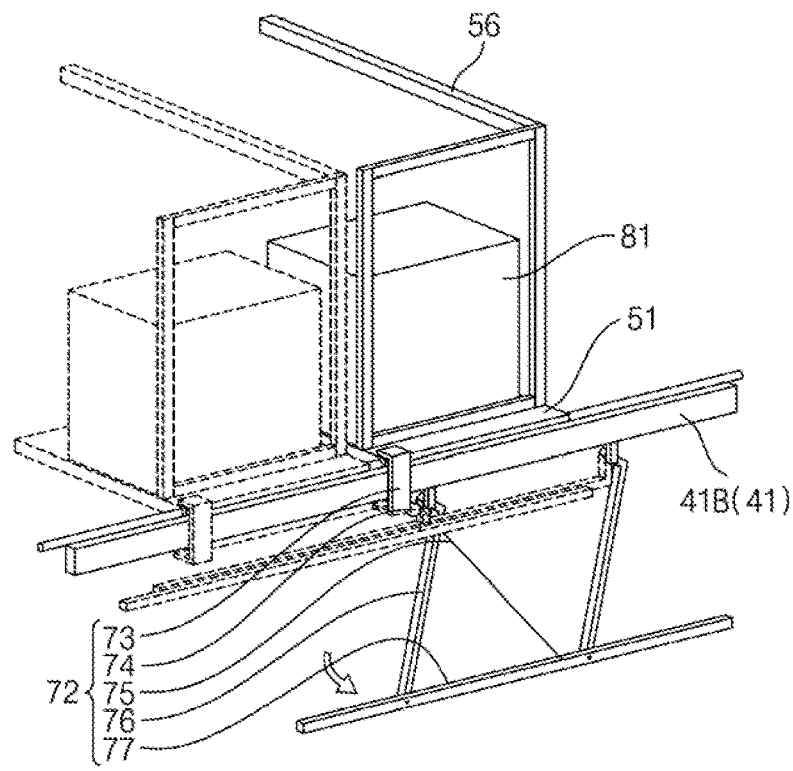

FIGS. 14 to 16 are perspective views explaining a shelf returning device 72 and an operating method thereof according to example embodiments.

Referring to FIG. 14, the shelf returning device 72 may include a connecting pin 73, an idler 74, a belt 75, a plurality of support bars 76, and a counterweight 77. The guide bar 43 may be mounted to a middle horizontal frame 41B of a main frame 41. A first upper shelf 51 may be connected to the guide bar 43. A material 81 to be transferred may be stacked on the first upper shelf 51. A first guide 56 may be mounted on the first upper shelf 51. The first upper shelf 51 may horizontally move along the guide bar 43.

The connecting pin 73 may be mounted to the first upper shelf 51. The idler 74 may be mounted to the middle horizontal frame 41B. The idler 74 may be mounted at a position of the middle horizontal frame 41B adjacent to the first upper shelf 51. The idler 74 may be disposed adjacent to the connecting pin 73. The counterweight 77 may be disposed below the connecting pin 73. The plurality of support bars 76 may be connected between the middle horizontal frame 41B and the counterweight 77. The belt 75 may be connected between the connecting pin 73 and the counterweight 77. The counterweight 77 may have a bar shape, a spherical shape, a polygonal pyramid shape, or a combination thereof. The counterweight 77 may be a weight of 1 to 10 kg. For example, the counterweight 77 may weigh about 7 to 8 kg. The support bars 76 may be omitted.

Referring to FIG. 15, when the first guide 56 is pushed in an arrow direction, the first upper shelf 51 may be horizontally moved along the guide bar 43. In accordance with horizontal movement of the first upper shelf 51, the connecting pin 73 may also be moved and, as such, the counterweight 77 connected to the belt 75 may be upwardly lifted. In this process, the belt 75 may be moved to extend horizontally parallel to the guide bar 43 and the support bars 76 may be rotated to extend horizontally parallel to the guide bar 43 as shown in FIG. 15.

Referring to FIG. 16, when pushing force applied to the first guide 56 is released, the counterweight 77 may move downwards due to gravity. As pulling force is applied to the connecting pin 73 connected to the belt 75, the first upper shelf 51 may horizontally move along the guide bar 43 and, as such, may return to an original position thereof.

Figure 17:
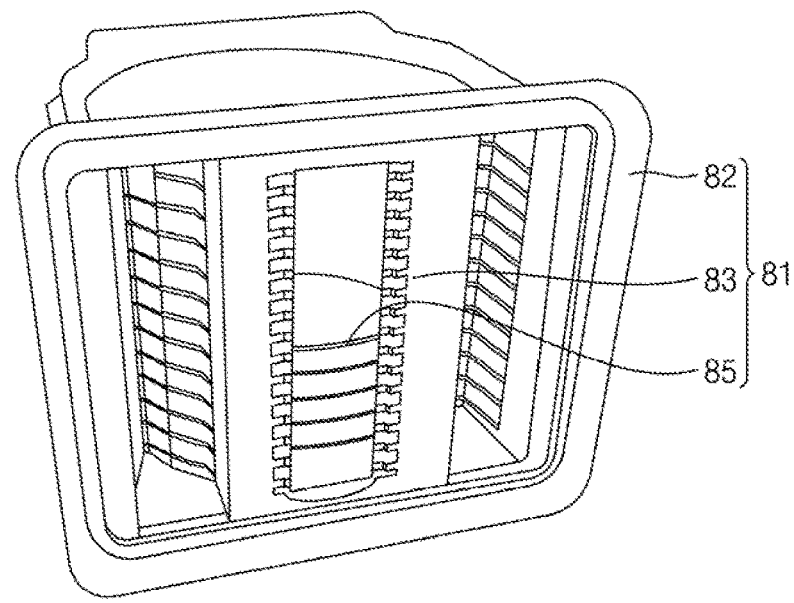
FIG. 17 is a perspective view explaining a configuration of a material to be transferred according to example embodiments.

FIG. 17 is a perspective view explaining a configuration of a material to be transferred according to example embodiments.

Referring to FIG. 17, in an embodiment, a material 81 to be transferred may include a front opening unified pod (FOUP). The material 81 may include a case 82, a carrier 83, and a plurality of substrates 85. The plurality of substrates 85 may include a semiconductor substrate such as a silicon wafer or a silicon-on-insulator (SOI) wafer. The plurality of substrates 85 may be stacked in the carrier 83 while being spaced apart from one another. The carrier 83 may be stored in the case 82.

Figure 18:
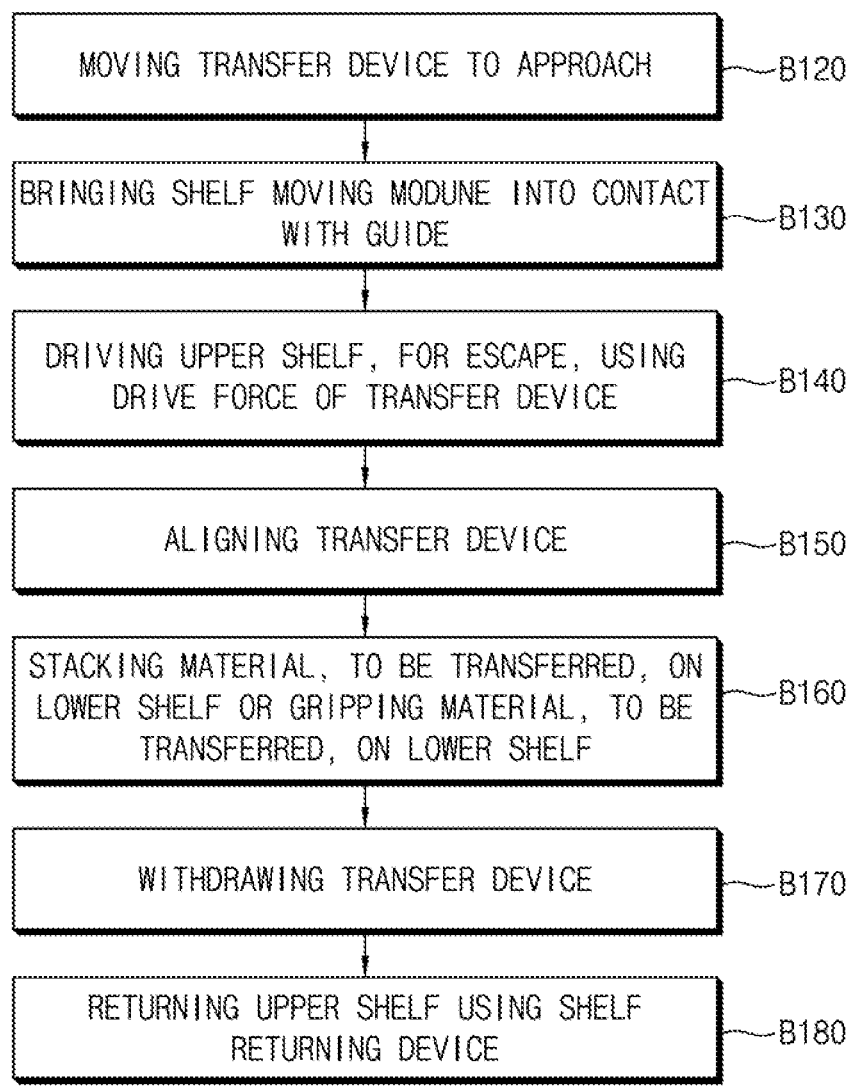
FIG. 18 is a flowchart explaining an operating method of a storage system according to example embodiments.

FIG. 18 is a flowchart explaining an operating method of a storage system according to example embodiments.

Referring to FIG. 18, the operating method of the storage system according to example embodiments may include moving a transfer device to approach a target point (B120), bringing a shelf moving module into contact with a guide (B130), driving an upper shelf, for escape, using drive force of the transfer device (B140), aligning the transfer device (B150), stacking a material, to be transferred, on a lower shelf or gripping a material, to be transferred, on the lower shelf (B160), withdrawing the transfer device (B170), and returning the upper shelf using a shelf returning device (B180).

Figure 19:
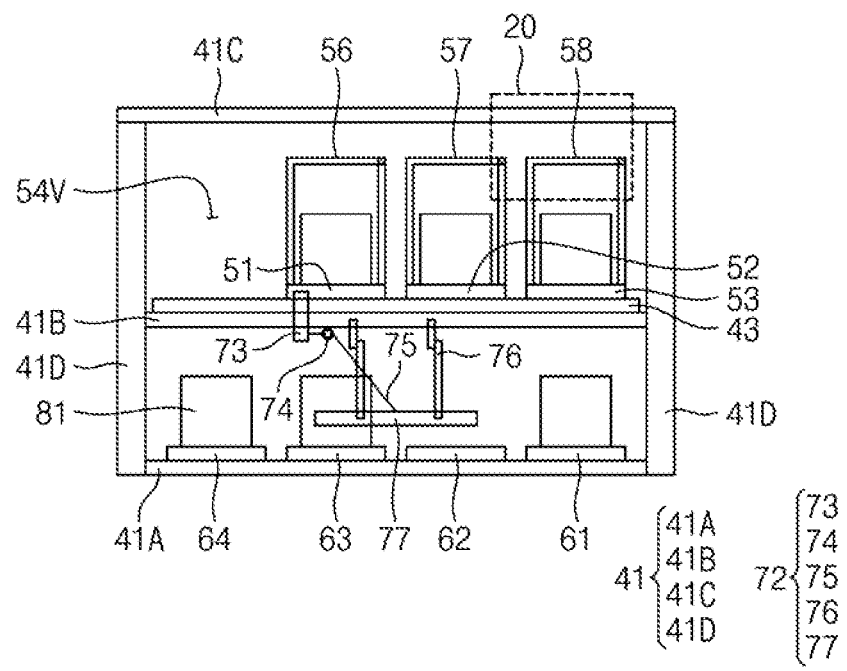
FIG. 19 is a front view explaining a storage device and an operating method thereof according to example embodiments.
Figure 20:
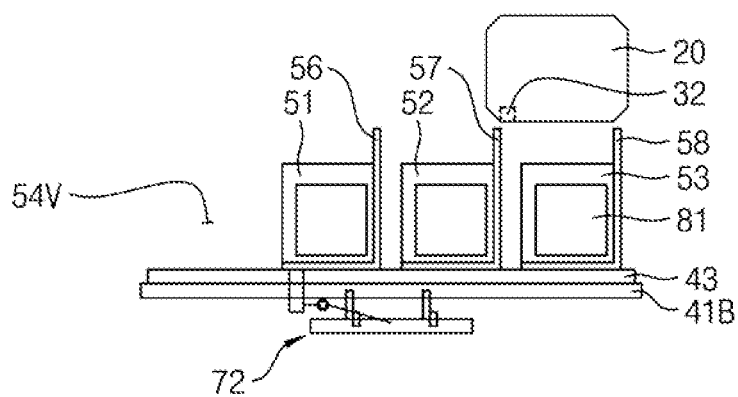
FIGS. 20 to 22 are top views explaining a storage device and an operating method according to example embodiments.
Figure 21:
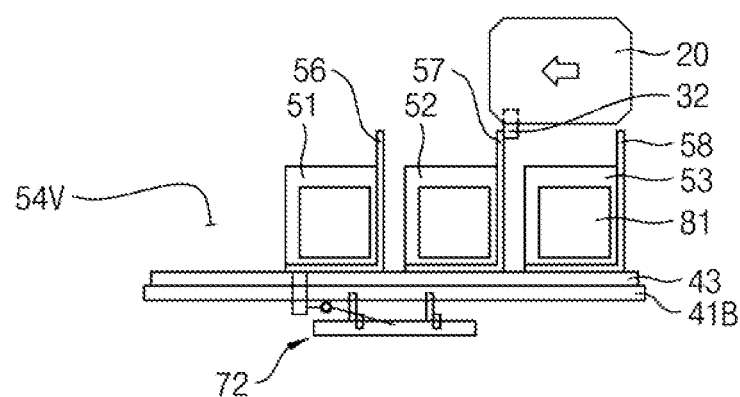
Figure 22:
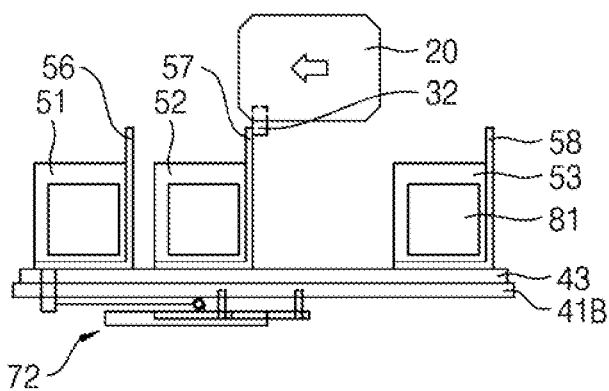

FIG. 19 is a front view explaining a storage device 40 and an operating method thereof according to example embodiments. FIGS. 20 to 22 are top views explaining a storage device 40 and an operating method according to example embodiments. FIGS. 23 to 30 are front views explaining a storage device 40 and an operating method according to example embodiments.

Referring to FIGS. 18, 19 and 20, a plurality of materials 81 to be transferred may be stored on the first lower shelf 61, the third lower shelf 63, the fourth lower shelf 64, and on each of the plurality of upper shelves 51, 52 and 53. The second lower shelf 62 may be in an empty state (or a preparation state). The transfer device 20 may move to approach a position between the second upper shelf 52 and the third upper shelf 53 (B120).

Referring to FIGS. 18 and 21, the shelf moving module 32 may be brought into contact with the second guide 57 on the second upper shelf 52 (B130). In an embodiment, the horizontal moving module 26 and the shelf moving module 32 may be controlled such that portions thereof protrude outside of the body 21, similarly to the case described with reference to FIG. 6. For example, the roller 34 of the shelf moving module 32 may be brought into contact with the second guide 57, similarly to the case described with reference to FIG. 13.

Pushing force may be applied to the second guide 57 in an arrow direction using drive force of the transfer device 20.

Figure 23:
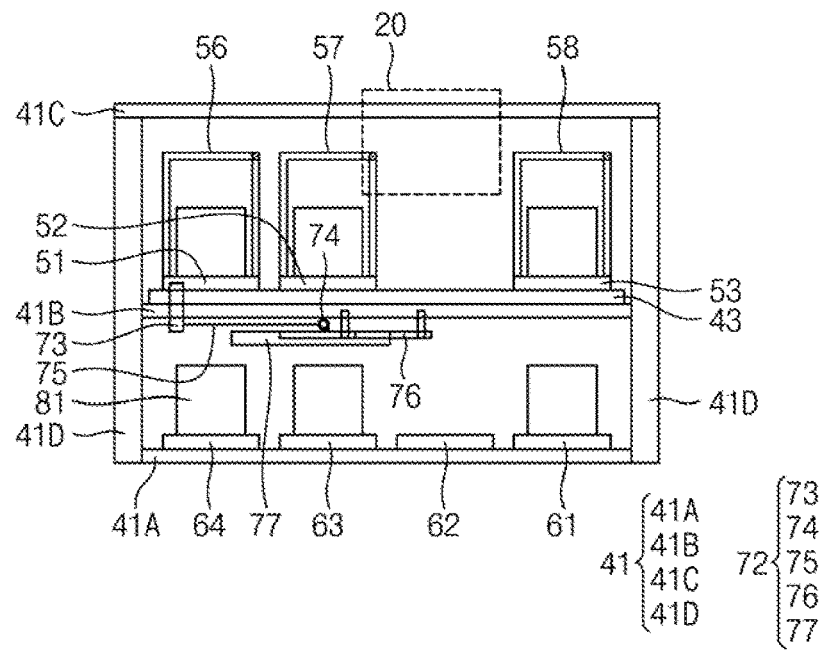
FIGS. 23 to 30 are front views explaining a storage device and an operating method according to example embodiments.

Referring to FIGS. 18, 22 and 23, the second upper shelf 52 may be driven for escape using drive force of the transfer device 20 (B140). In other words, the second upper shelf 52 may be moved out of the way to enable transfer of material 81 onto the second lower shelf 62.

In an embodiment, as pushing force is applied to the second guide 57 using drive force of the transfer device 20, the first upper shelf 51 and the second upper shelf 52 may horizontally move along the guide bar 43. The first upper shelf 51 may move into the empty space 54V. The first upper shelf 51 may be vertically aligned above the fourth lower shelf 64. The second upper shelf 52 may be vertically aligned above the third lower shelf 63. In accordance with horizontal movement of the first upper shelf 51, the connecting pin 73 may also be moved, and the counterweight 77 connected to the belt 75 may be upwardly lifted.

The transfer device 20 may be aligned between the second upper shelf 52 and the third upper shelf 53 (B150). The transfer device 20 may be aligned to be positioned above the second lower shelf 62. The shelf moving module 32 may contact the second guide 57 on the second upper shelf 52.

Figure 24:
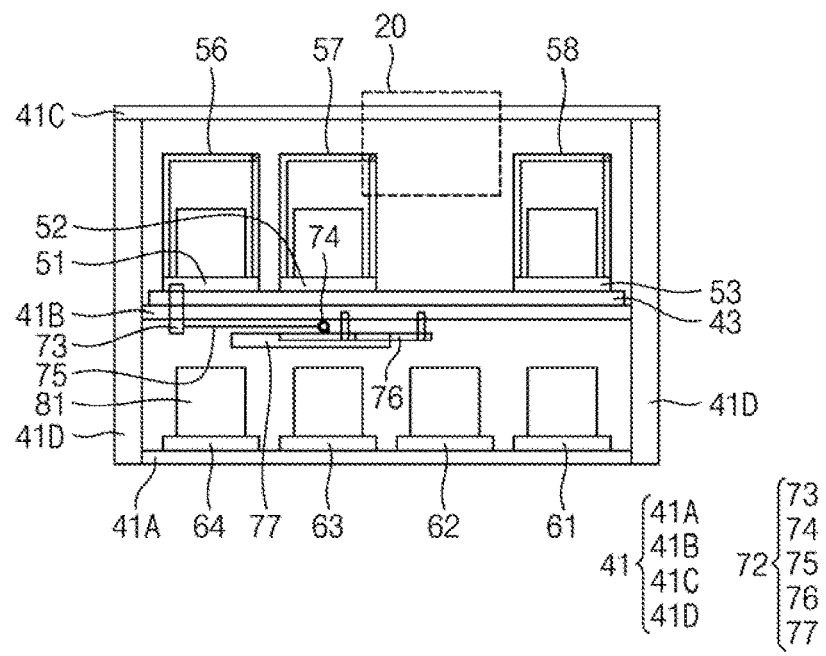

Referring to FIGS. 18 and 24, a material 81 to be transferred may be stacked on the second lower shelf 62 through a method similar to the method described with reference to FIGS. 4 to 9 (B160).

In an embodiment, the material 81 on the second lower shelf 62 may be lifted by the transfer device 20 in an order reverse to the order described with reference to FIGS. 18 to 24.

Again referring to FIGS. 18 and 2, the transfer device 20 may be withdrawn toward the outside of the storage device 40 (B170). The first upper shelf 51 and the second upper shelf 52 may be returned using the shelf returning device 72 (B180) to their original positions as shown in FIG. 2.

In an embodiment, force applied to the second guide 57 may be released in accordance with return of the shelf moving module 32, similarly to the case described with reference to FIG. 10. The counterweight 77 may move downwards due to gravity. Pulling force may be applied to the connecting pin 73 connected to the belt 75 and, as such, the first upper shelf 51 and the second upper shelf 52 may be horizontally moved along the guide bar 43, thereby returning to original positions thereof.

Figure 25:
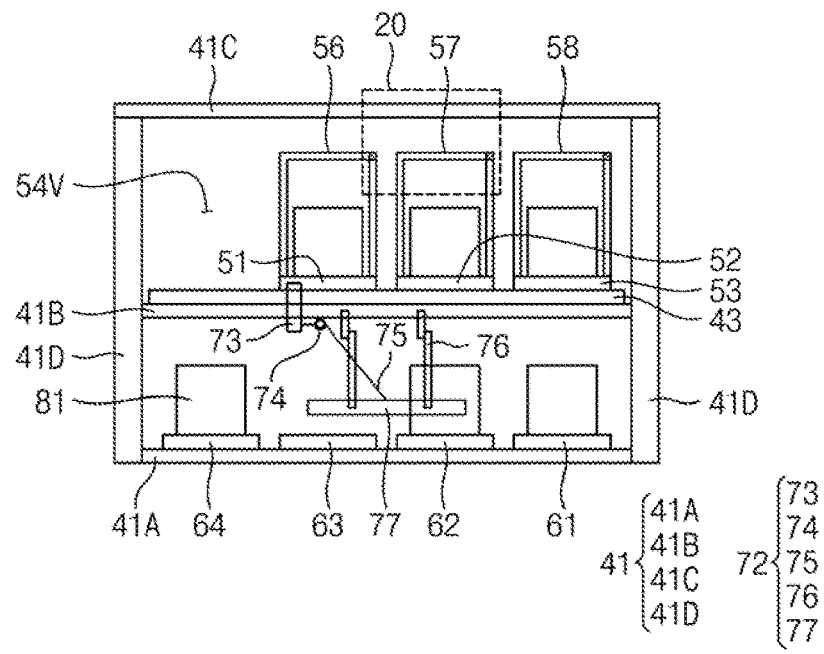

Referring to FIGS. 18 and 25, a plurality of materials 81 to be transferred may be stored on the first lower shelf 61, the second lower shelf 62, the fourth lower shelf 64, and the plurality of upper shelves 51, 52 and 53. The third lower shelf 63 may be in an empty state (or a preparation state). The transfer device 20 may move to approach a position between the first upper shelf 51 and the second upper shelf 52 (B120).

Figure 26:
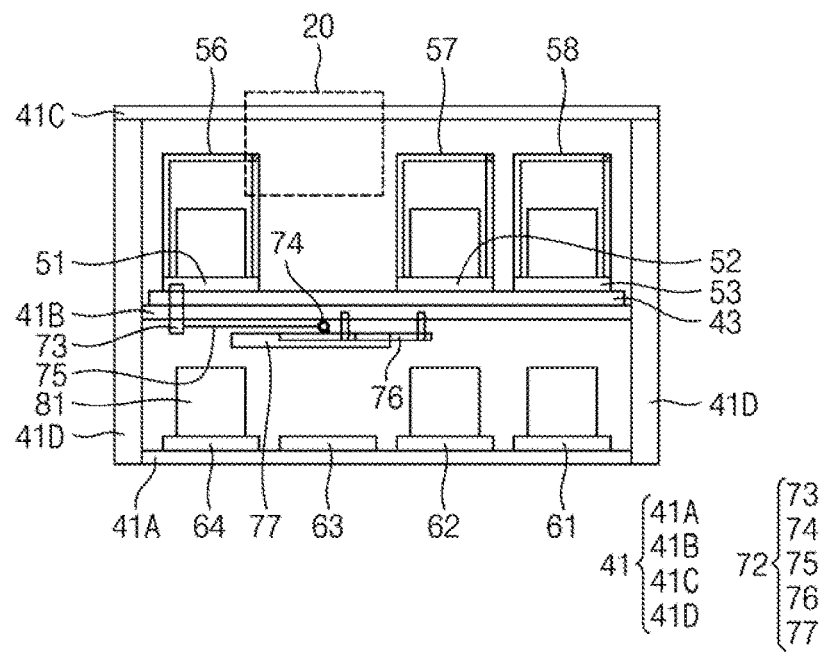

Referring to FIGS. 18 and 26, the shelf moving module 32 (see, e.g., FIG. 12) may be brought into contact with the first guide 56 on the first upper shelf 51 (B130). In an embodiment, the roller 34 of the shelf moving module 32 may contact the first guide 56, similarly to the case described with reference to FIG. 13.

The first upper shelf 51 may be driven for escape using drive force of the transfer device 20 (B140).

In an embodiment, pushing force may be applied to the first guide 56 using drive force of the transfer device 20 and, as such, the first upper shelf 51 may be horizontally moved along the guide bar 43. The first upper shelf 51 may move into the empty space 54V. The first upper shelf 51 may be vertically aligned above the fourth lower shelf 64. In accordance with horizontal movement of the first upper shelf 51, the connecting pin 73 may also be moved, and the counterweight 77 connected to the belt 75 may be upwardly lifted.

The transfer device 20 may be aligned between the first upper shelf 51 and the second upper shelf 52 (B150). The transfer device 20 may be aligned to be positioned above the third lower shelf 63. The shelf moving module 32 (see, e.g., FIG. 13) may be brought into contact the first guide 56 on the first upper shelf 51.

Figure 27:
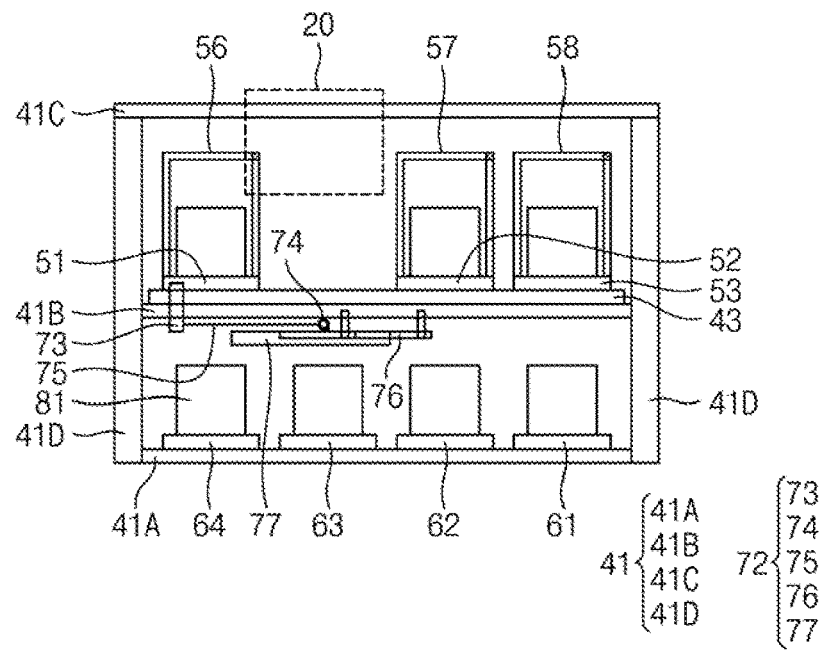

Referring to FIGS. 18 and 27, a material 81 to be transferred may be stacked on the third lower shelf 63 (B160).

Again referring to FIGS. 18 and 2, the transfer device 20 may be withdrawn toward the outside of the storage device 40 (B170). The first upper shelf 51 may be returned using the shelf returning device 72 (B180) to their original positions as shown in FIG. 2.

Figure 28:
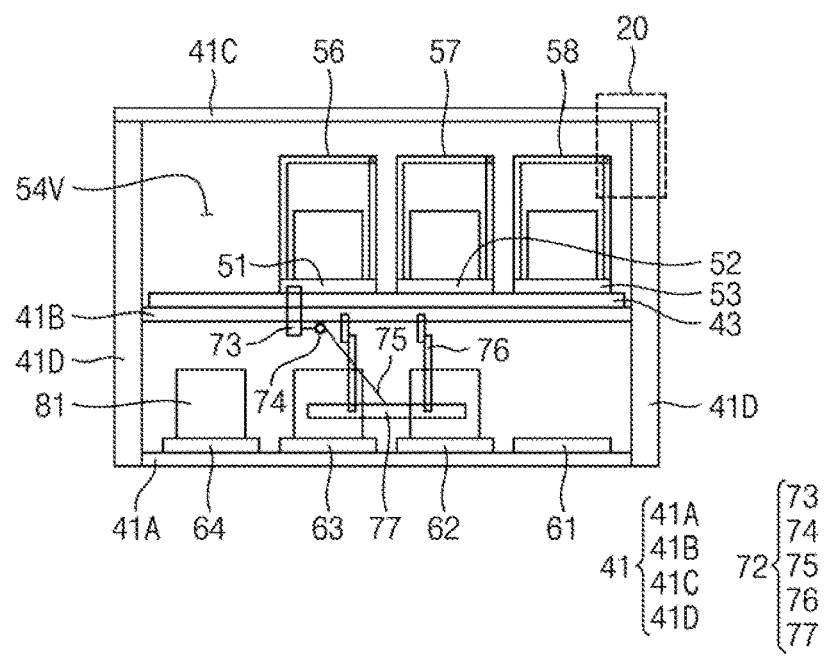

Referring to FIGS. 18 and 28, a plurality of materials 81 to be transferred may be stored on the second lower shelf 62, the third lower shelf 63, the fourth lower shelf 64, and the plurality of upper shelves 51, 52 and 53. The first lower shelf 61 may be in an empty state (or a preparation state). The transfer device 20 may move to approach the third upper shelf 53 (B120).

Figure 29:
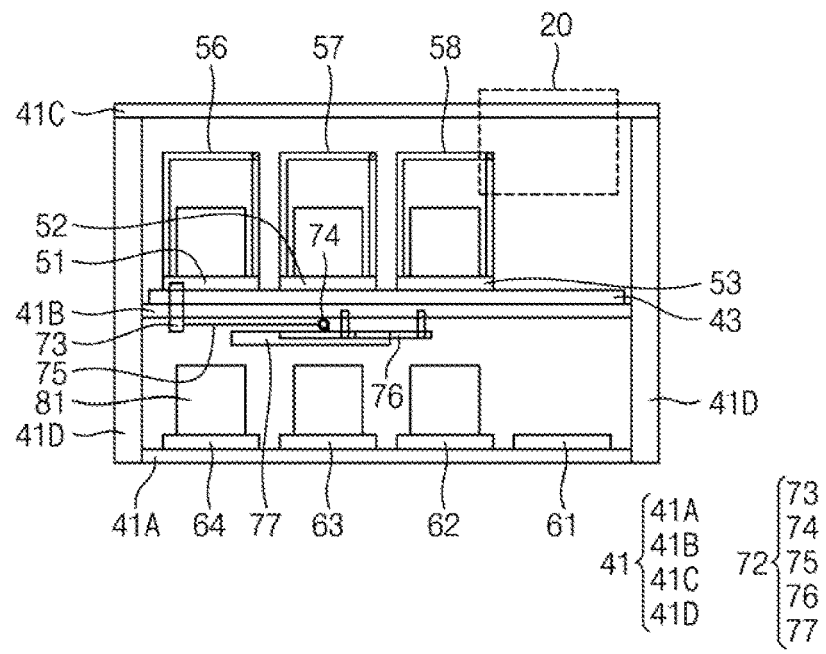

Referring to FIGS. 18 and 29, the shelf moving module 32 (see, e.g., FIG. 12) may be brought into contact with the third guide 58 on the third upper shelf 53 (B130). In an embodiment, the roller 34 of the shelf moving module 32 may be brought into contact with the third guide 58, similarly to the case described with reference to FIG. 13.

The third upper shelf 53 may be driven for escape using drive force of the transfer device 20 (B140).

In an embodiment, as pushing force is applied to the third guide 58 using drive force of the transfer device 20, the first upper shelf 51, the second upper shelf 52 and the third upper shelf 53 may horizontally move along the guide bar 43. The first upper shelf 51 may move into the empty space 54V. The first upper shelf 51 may be vertically aligned above the fourth lower shelf 64. The second upper shelf 52 may be vertically aligned above the third lower shelf 63. The third upper shelf 53 may be vertically aligned above the second lower shelf 62. In accordance with horizontal movement of the first upper shelf 51, the connecting pin 73 may also be moved, and the counterweight 77 connected to the belt 75 may be upwardly lifted.

The transfer device 20 may be aligned to be adjacent to the third upper shelf 53 (B150). The transfer device 20 may be aligned to be positioned above the first lower shelf 61. The shelf moving module 32 (see, e.g., FIG. 13) may contact the third guide 58 on the third upper shelf 53.

Figure 30:
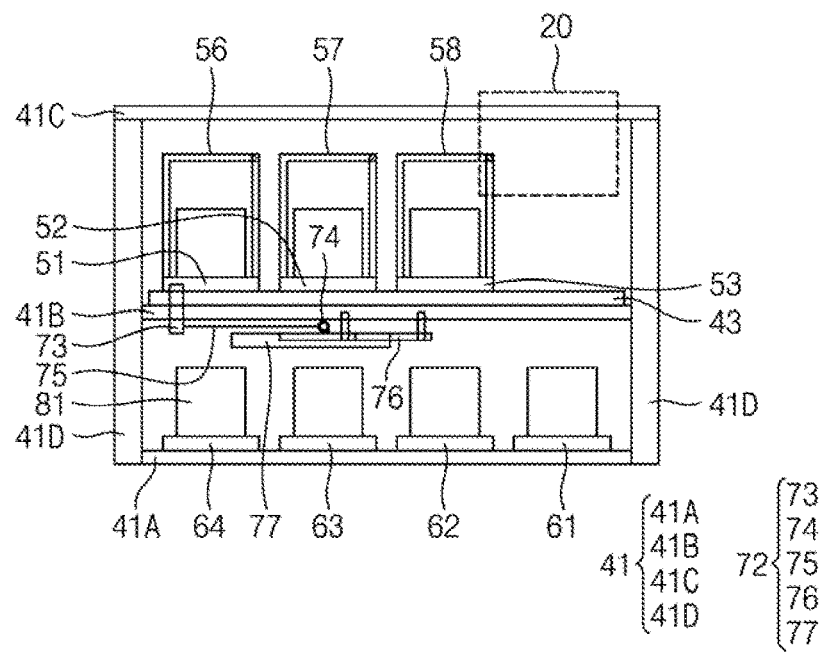

Referring to FIGS. 18 and 30, a material 81 to be transferred may be stacked on the first lower shelf 61 (B160).

Again referring to FIGS. 18 and 2, the transfer device 20 may be withdrawn toward the outside of the storage device 40 (B170). The first upper shelf 51, the second upper shelf 52, and the third upper shelf 53 may be returned using the shelf returning device 72 (B180) to their original positions as shown in FIG. 2.

In an embodiment, the plurality of materials 81 on the first upper shelf 51, the second upper shelf 52, the third upper shelf 53 and the fourth lower shelf 64 may be stacked or transferred through a method similar to the method described with reference to FIGS. 1 to 10.

In an embodiment, the shelf returning device 72 may be omitted. The shelf moving module 32 (see, e.g., FIG. 12) may perform a function of driving, for escape, or returning at least one selected from the plurality of upper shelves 51, 52 and 53 through a method similar to the method described with reference to FIGS. 1 to 13.

In accordance with the example embodiments, a storage system including a storage device and a transfer device is provided. The storage device may include a plurality of guides connected to a plurality of upper shelves, and a shelf returning device connected to a selected one of the plurality of upper shelves. The shelf returning device may include a counterweight. The transfer device may include a shelf moving module contacting a selected one of the plurality of guides. The shelf moving module may perform a function of shifting a position of the plurality of upper shelves using drive force of the transfer device. The shelf returning device may perform a function of returning the plurality of upper shelves to an original position thereof using the weight of the counterweight. A storage system and an operating method thereof, which are capable of minimizing manufacturing costs and operating costs, may be provided.

While example embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A storage system comprising:
   a storage device; and
   a transfer device,
   wherein the storage device comprises:
   a guide bar,
   a plurality of upper shelves connected to the guide bar, the plurality of upper shelves storing a material to be transferred,
   a plurality of lower shelves disposed under the plurality of upper shelves, the plurality of lower shelves storing the material,
   a plurality of guides connected to the plurality of upper shelves, and
   a shelf returning device connected to a selected upper shelf from among the plurality of upper shelves,
   wherein the transfer device comprises:
   a body,
   a drive module attached to the body, the drive module being configured to move the transfer device to be adjacent to the storage device,
   a handling module attached to the body, the handling module being configured to handle the material, and
   a shelf moving module attached to the body or the handling module, the shelf moving module contacting a selected guide from among the plurality of guides, and
   wherein the shelf returning device comprises:
   a counterweight; and
   at least one support bar connected between a horizontal frame of the storage device and the counterweight, the at least one support bar configured to be rotated to extend substantially parallel to the guide bar in response to horizontal movement of at least one of the plurality of upper shelves or at least one of the plurality of lower shelves.

2. The storage system according to claim 1, wherein the shelf moving module comprises:
   a roller contacting the selected guide; and
   a protrusion connected between the roller and the body or between the roller and the handling module.

3. The storage system according to claim 1, wherein the handling module comprises:
   a horizontal moving module connected to the body;
   an elevation module connected to the horizontal moving module; and
   a hand module connected to the elevation module.

4. The storage system according to claim 3, wherein the shelf moving module is attached to the horizontal moving module.

5. The storage system according to claim 1, wherein the storage device further comprises a middle horizontal frame connected to the guide bar, and
   wherein the shelf returning device further comprises:
   a connecting pin connected to the selected one from among the plurality of upper shelves;
   an idler connected to the middle horizontal frame; and
   a belt connected between the connecting pin and the counterweight, the belt contacting the idler.

6. The storage system according to claim 1, wherein the counterweight has a weight of 1 to 10 kg.

7. The storage system according to claim 1, wherein a number of the plurality of upper shelves is smaller than a number of the plurality of lower shelves.

8. The storage system according to claim 1, wherein a portion of each of the plurality of guides protrudes outside of the plurality of upper shelves.

9. An operating method of the storage system of claim 1, the operating method comprising:
   moving the transfer device to approach the storage device;
   bringing the shelf moving module into contact with the selected guide;
   driving, for escape, at least one upper shelf selected from among the plurality of upper shelves using a drive force of the transfer device;
   aligning the transfer device to be adjacent to a corresponding lower shelf from among the plurality of lower shelves over the corresponding lower shelf;
   stacking the material on the corresponding lower shelf;
   withdrawing the transfer device; and
   returning the at least one upper shelf using the shelf returning device.

10. A storage system comprising:
    a storage device; and
    a transfer device,
    wherein the storage device comprises:
    a guide bar,
    a plurality of upper shelves connected to the guide bar, the plurality of upper shelves storing a material to be transferred, a plurality of lower shelves disposed under the plurality of upper shelves, the plurality of lower shelves storing the material, and a plurality of guides connected to the plurality of upper shelves, wherein the transfer device comprises:

a body, a drive module attached to the body, the drive module being configured to move the transfer device to be adjacent to the storage device, a handling module attached to the body, the handling module being configured to handle the material, and a shelf moving module attached to the body or the handling module, the shelf moving module contacting a selected guide from among the plurality of guides, and wherein the storage device further comprises:

a counterweight and at least one support bar connected between the guide bar and the counterweight, the at least one support bar configured to be rotated to extend substantially parallel to the guide bar in response to horizontal movement of at least one of the plurality of upper shelves or at least one of the plurality of lower shelves.

11. The storage system according to claim 10, wherein the shelf moving module comprises:

a roller contacting the selected guide; and a protrusion connected between the roller and the body or between the roller and the handling module.

12. The storage system according to claim 10, wherein the handling module comprises:

a horizontal moving module connected to the body;

an elevation module connected to the horizontal moving module; and a hand module connected to the elevation module.

13. The storage system according to claim 12, wherein the shelf moving module is attached to the horizontal moving module.

14. The storage system according to claim 10, wherein a number of the plurality of upper shelves is smaller than a number of the plurality of lower shelves.

15. The storage system according to claim 1, wherein a portion of each of the plurality of guides protrudes outside of the plurality of upper shelves.

16. A storage system comprising:

a main frame comprising a lower horizontal frame, a middle horizontal frame on the lower horizontal frame, and an upper horizontal frame on the middle horizontal frame;

a guide bar connected to the middle horizontal frame;

a plurality of upper shelves connected to the guide bar, the plurality of upper shelves storing a material to be transferred;

a plurality of lower shelves connected to the lower horizontal frame, the plurality of lower shelves storing the material;

a plurality of guides connected to the plurality of upper shelves; and a shelf returning device connected to a selected upper shelf from among the plurality of upper shelves, wherein the shelf returning device comprises:

a connecting pin connected to the selected upper shelf, an idler connected to the middle horizontal frame, a belt connected to the connecting pin, the belt contacting the idler, a counterweight connected to the belt, and at least one support bar connected between the middle horizontal frame and the counterweight, the at least one support bar configured to be rotated to extend substantially parallel to the middle horizontal frame in response to horizontal movement of at least one of the plurality of upper shelves or at least one of the plurality of lower shelves.

17. The storage system according to claim 16, wherein a number of the plurality of upper shelves is smaller than a number of the plurality of lower shelves.

18. The storage system according to claim 16, wherein a horizontal width of each of the plurality of upper shelves is substantially equal to a horizontal width of each of the plurality of lower shelves.

* * * * *